(12) United States Patent
Tan et al.

(10) Patent No.: US 12,191,280 B2
(45) Date of Patent: Jan. 7, 2025

(54) CERAMIC CARRIER AND BUILD UP CARRIER FOR LIGHT-EMITTING DIODE (LED) ARRAY

(71) Applicant: LUMILEDS LLC, San Jose, CA (US)

(72) Inventors: Loon-Kwang Tan, Kepala Batas (MY); Tze Yang Hin, Cupertino, CA (US)

(73) Assignee: LUMILEDS, LLC, San Jose, CA (US)

( * ) Notice: Subject to any disclaimer, the term of this patent is extended or adjusted under 35 U.S.C. 154(b) by 0 days.

(21) Appl. No.: 18/303,378

(22) Filed: Apr. 19, 2023

(65) Prior Publication Data

US 2023/0253365 A1 Aug. 10, 2023

Related U.S. Application Data

(62) Division of application No. 16/809,104, filed on Mar. 4, 2020, now Pat. No. 11,664,347.

(60) Provisional application No. 62/958,058, filed on Jan. 7, 2020.

(51) Int. Cl.
  *H01L 25/065* (2023.01)
  *H01L 21/48* (2006.01)
  *H01L 23/498* (2006.01)
  *H01L 27/15* (2006.01)

(52) U.S. Cl.
  CPC ........ *H01L 25/0655* (2013.01); *H01L 21/481* (2013.01); *H01L 21/4846* (2013.01); *H01L 23/49838* (2013.01); *H01L 27/15* (2013.01)

(58) Field of Classification Search
  CPC ............... H01L 25/0655; H01L 21/481; H01L 21/4846; H01L 23/49838; H01L 27/15; H01L 23/15; H01L 21/4857; H01L 23/49822; H01L 25/0753; H01L 2933/0066; H01L 33/62
  USPC ........................................................ 438/455
  See application file for complete search history.

(56) References Cited

U.S. PATENT DOCUMENTS

| 5,073,814 | A | 12/1991 | Cole, Jr. et al. |
| 5,336,453 | A | 8/1994 | Giller et al. |
| 5,621,225 | A | 4/1997 | Shieh et al. |
| 6,531,328 | B1 * | 3/2003 | Chen ................ H01L 33/486 438/106 |
| 6,576,869 | B1 * | 6/2003 | Gower ............... B23K 26/389 219/121.7 |
| 6,730,391 | B1 | 5/2004 | Saijo et al. |

(Continued)

FOREIGN PATENT DOCUMENTS

| CN | 102315208 | 1/2012 |
| CN | 204641532 | 9/2015 |

(Continued)

OTHER PUBLICATIONS

Extended European Search Report dated Oct. 19, 2020 for the European Patent Application No. 20169027.8.

(Continued)

*Primary Examiner* — Duy T Nguyen
(74) *Attorney, Agent, or Firm* — Volpe Koenig

(57) ABSTRACT

Circuit boards, LED lighting systems and methods of manufacture are described. A circuit board includes a ceramic carrier and a body on the ceramic carrier. The body includes dielectric layers and slots formed completely through a thickness of the dielectric layers. The slots are filled with a dielectric material. A conductive pad is provided on a surface of each of the slots opposite the ceramic carrier.

16 Claims, 12 Drawing Sheets

(56) References Cited

U.S. PATENT DOCUMENTS

| | | | |
|---|---|---|---|
| 6,936,855 B1 | 5/2005 | Harrah | |
| 7,550,319 B2 | 6/2009 | Wang et al. | |
| 8,455,892 B2 | 6/2013 | Fukui | |
| 8,513,790 B2 | 8/2013 | Chen et al. | |
| 8,536,714 B2 | 9/2013 | Sakaguchi | |
| 8,773,006 B2 | 7/2014 | Kim et al. | |
| 8,851,682 B2 | 10/2014 | Tanigawa et al. | |
| 8,912,650 B2 | 12/2014 | Choi et al. | |
| 9,018,655 B2 | 4/2015 | Tu et al. | |
| 9,516,713 B2 | 12/2016 | Matsukura | |
| 9,615,453 B2 | 4/2017 | Yang | |
| 9,653,397 B2 | 5/2017 | Kwon et al. | |
| 9,761,776 B2 | 9/2017 | Tomohiro | |
| 9,899,465 B2 | 2/2018 | Bower et al. | |
| 9,978,707 B1 | 5/2018 | Zimmerman et al. | |
| 10,005,384 B2 | 6/2018 | Canonne et al. | |
| 10,205,055 B2 | 2/2019 | Chu et al. | |
| 10,262,977 B2 | 4/2019 | Henry et al. | |
| 10,312,224 B2 | 6/2019 | Edmond et al. | |
| 10,347,509 B1 | 7/2019 | Shen | |
| 10,388,875 B2 | 8/2019 | Yasumoto et al. | |
| 10,420,204 B2 | 9/2019 | Lin et al. | |
| 10,529,690 B2 | 1/2020 | Shih et al. | |
| 10,665,578 B2 | 5/2020 | Huitema et al. | |
| 10,683,986 B2 | 6/2020 | Lefaudeux et al. | |
| 10,754,473 B2 | 8/2020 | Teranishi et al. | |
| 10,847,506 B2 | 11/2020 | Yoo | |
| 11,610,935 B2 | 3/2023 | Hin et al. | |
| 2003/0020156 A1 | 1/2003 | Farquhar | |
| 2003/0136577 A1 | 7/2003 | Abe | |
| 2005/0263867 A1 | 12/2005 | Kambe et al. | |
| 2005/0269287 A1 | 12/2005 | Tsujimura et al. | |
| 2006/0141851 A1 | 6/2006 | Matsui et al. | |
| 2007/0080458 A1 | 4/2007 | Ogawa et al. | |
| 2009/0046432 A1 | 2/2009 | Hsu | |
| 2009/0207630 A1 | 8/2009 | Satoh et al. | |
| 2010/0039817 A1 | 2/2010 | Wen et al. | |
| 2010/0155746 A1 | 6/2010 | Ibbetson et al. | |
| 2010/0300733 A1* | 12/2010 | Kim | H05K 3/28 156/89.12 |
| 2011/0030209 A1 | 2/2011 | Chang et al. | |
| 2011/0121347 A1 | 5/2011 | Liu et al. | |
| 2012/0106140 A1 | 5/2012 | Sun et al. | |
| 2012/0175643 A1 | 7/2012 | West | |
| 2012/0188734 A1 | 7/2012 | Mikado et al. | |
| 2012/0273960 A1 | 11/2012 | Park et al. | |
| 2013/0075924 A1 | 3/2013 | Lin et al. | |
| 2013/0193463 A1 | 8/2013 | Kong et al. | |
| 2013/0221452 A1 | 8/2013 | Strothmann et al. | |
| 2013/0328067 A1 | 12/2013 | Tsou et al. | |
| 2014/0021493 A1 | 1/2014 | Andrews | |
| 2014/0061930 A1 | 3/2014 | Holmes | |
| 2014/0124777 A1 | 5/2014 | Nakatani et al. | |
| 2014/0182896 A1 | 7/2014 | Lee et al. | |
| 2014/0251658 A1 | 9/2014 | Lin et al. | |
| 2014/0268780 A1 | 9/2014 | Wang et al. | |
| 2014/0306845 A1 | 10/2014 | Shiu et al. | |
| 2014/0353827 A1 | 12/2014 | Liu et al. | |
| 2015/0054001 A1 | 2/2015 | Oganesian et al. | |
| 2015/0054406 A1 | 2/2015 | Gershowitz et al. | |
| 2015/0084206 A1 | 3/2015 | Lin | |
| 2015/0200185 A1 | 7/2015 | Yu et al. | |
| 2015/0303219 A1 | 10/2015 | Tada | |
| 2015/0319868 A1 | 11/2015 | Wei et al. | |
| 2015/0371585 A1 | 12/2015 | Bower et al. | |
| 2016/0050771 A1 | 2/2016 | Yu et al. | |
| 2016/0064329 A1 | 3/2016 | Lee et al. | |
| 2016/0172402 A1 | 6/2016 | Katkar | |
| 2016/0181480 A1 | 6/2016 | Cumpston | |
| 2016/0240745 A1 | 8/2016 | Kim et al. | |
| 2016/0273741 A1 | 9/2016 | Jung | |
| 2016/0316565 A1 | 10/2016 | Chen et al. | |
| 2016/0324004 A1 | 11/2016 | Schwarz et al. | |
| 2017/0009978 A1 | 1/2017 | Hong et al. | |
| 2017/0025593 A1 | 1/2017 | Bower et al. | |
| 2017/0033062 A1 | 2/2017 | Liu et al. | |
| 2017/0040306 A1 | 2/2017 | Kim et al. | |
| 2017/0062383 A1 | 3/2017 | Yee et al. | |
| 2017/0092627 A1 | 3/2017 | Hu et al. | |
| 2017/0140202 A1 | 5/2017 | Huang et al. | |
| 2017/0194302 A1 | 7/2017 | Disney | |
| 2017/0221865 A1 | 8/2017 | West et al. | |
| 2017/0263546 A1 | 9/2017 | Lin et al. | |
| 2017/0358562 A1 | 12/2017 | Banna et al. | |
| 2018/0019233 A1 | 1/2018 | Chang et al. | |
| 2018/0025949 A1 | 1/2018 | Sohn et al. | |
| 2018/0069163 A1 | 3/2018 | Clark et al. | |
| 2018/0116056 A1 | 4/2018 | Chen et al. | |
| 2018/0166373 A1 | 6/2018 | Lin et al. | |
| 2018/0166429 A1 | 6/2018 | Chong et al. | |
| 2018/0175262 A1 | 6/2018 | Jansen et al. | |
| 2018/0197471 A1 | 7/2018 | Rotzoll et al. | |
| 2018/0226386 A1 | 8/2018 | Cok | |
| 2018/0269188 A1 | 9/2018 | Yu et al. | |
| 2018/0269191 A1 | 9/2018 | England et al. | |
| 2018/0269234 A1 | 9/2018 | Hughes et al. | |
| 2018/0337135 A1 | 11/2018 | Yoshihiro et al. | |
| 2018/0337142 A1 | 11/2018 | Cheng et al. | |
| 2018/0358317 A1 | 12/2018 | Albers et al. | |
| 2019/0056067 A1 | 2/2019 | Price et al. | |
| 2019/0066571 A1 | 2/2019 | Goward | |
| 2019/0075656 A1 | 3/2019 | Kim et al. | |
| 2019/0088603 A1 | 3/2019 | Marimuthu et al. | |
| 2019/0096864 A1 | 3/2019 | Huitema et al. | |
| 2019/0122976 A1* | 4/2019 | Liang | H01L 24/81 |
| 2019/0181315 A1* | 6/2019 | Liao | H01L 23/49894 |
| 2019/0206833 A1 | 7/2019 | Meyer et al. | |
| 2019/0006283 A1 | 10/2019 | Wang et al. | |
| 2019/0302917 A1 | 10/2019 | Pan | |
| 2019/0305205 A1 | 10/2019 | Feichtinger | |
| 2019/0319020 A1 | 10/2019 | Pan | |
| 2019/0333444 A1 | 10/2019 | He et al. | |
| 2019/0341342 A1* | 11/2019 | Raorane | H01L 21/4857 |
| 2019/0360673 A1 | 11/2019 | Seo | |
| 2019/0385513 A1 | 12/2019 | Iguchi et al. | |
| 2020/0105638 A1 | 4/2020 | Chiang et al. | |
| 2020/0119235 A1 | 4/2020 | Ahmed et al. | |
| 2020/0176346 A1 | 6/2020 | Wu et al. | |
| 2020/0251626 A1 | 8/2020 | Lee et al. | |
| 2021/0028766 A1 | 1/2021 | Hurwitz et al. | |
| 2021/0074645 A1 | 3/2021 | Tsai et al. | |
| 2021/0125932 A1* | 4/2021 | Chavali | H01L 21/486 |
| 2021/0125971 A1 | 4/2021 | Chu et al. | |
| 2021/0151648 A1 | 5/2021 | Hin et al. | |

FOREIGN PATENT DOCUMENTS

| | | | |
|---|---|---|---|
| CN | 107580385 | | 1/2018 |
| EP | 3113236 | | 1/2017 |
| EP | 3582593 | | 12/2019 |
| JP | H11163412 A | | 6/1999 |
| JP | 2007-123482 A | | 5/2007 |
| JP | 2007-129188 | | 5/2007 |
| JP | 2008-283133 | | 11/2008 |
| JP | 2009-158505 A | | 7/2009 |
| JP | 2009-186734 | | 8/2009 |
| JP | 2011-113989 | | 6/2011 |
| JP | 2018-174355 A | | 11/2018 |
| JP | 2019-046835 A | | 3/2019 |
| KR | 10-2013-0036650 | | 4/2013 |
| TW | 200830975 | | 7/2008 |
| TW | 200942105 | | 10/2009 |
| WO | WO0111325 | * | 2/2001 |
| WO | 2018/116814 | | 6/2018 |
| WO | 2018/172152 | | 9/2018 |
| WO | 2019/013469 | | 1/2019 |
| WO | 2019/126537 A1 | | 6/2019 |
| WO | 2019/168763 | | 9/2019 |

OTHER PUBLICATIONS

Extended European Search Report dated Sep. 2, 2020 for European Patent Application No. 20158481.0.

(56) References Cited

OTHER PUBLICATIONS

Extended European Search Report dated Jul. 7, 2020 for European Patent Application No. 20157985.1.
Extended European Search Report dated Jul. 30, 2020 for European Patent Application No. 20158288.9.
Extended European Search Report dated Sep. 11, 2020 for European Patent Application No. 20166601.3.
International Search Report and Written Opinion issued Feb. 11, 2021 for PCT International Application No. PCT/US2020/061205.
International Search Report and Written Opinion issued Feb. 17, 2021 for PCT International Application No. PCT/US2020/061206.
Annex to Form PCT/ISA/206, Communication Relating to the Results of the Partial International Search issued Mar. 4, 2021 for PCT International Application No. PCT/US2020/061201.
International Search Report and Written Opinion mailed Apr. 8, 2021 for PCT International Application No. PCT/US2021/012425.
International Search Report and Written Opinion mailed Apr. 16, 2021 for PCT International Application No. PCT/US2020/066998.
International Search Report and Written Opinion mailed Apr. 28, 2021 for PCT International Application No. PCT/US2020/061201.
International Search Report and Written Opinion mailed Jun. 29, 2021 for PCT International Application No. PCT/US2021/021702.
Japanese Office Action issued Sep. 12, 2023 for Japanese Patent Application No. 2022-529112.

\* cited by examiner

CERAMIC CARRIER AND BUILD UP CARRIER FOR LIGHT-EMITTING DIODE (LED) ARRAY

CROSS-REFERENCE TO RELATED APPLICATIONS

This application division of U.S. patent application Ser. No. 16/809,104, filed Mar. 4, 2020, which claims the benefit of U.S. Provisional Application No. 62/958,058, filed Jan. 7, 2020, the contents of which are incorporated herein by reference.

BACKGROUND

Precision control lighting applications may require production and manufacturing of small addressable light-emitting diode (LED) lighting systems. The smaller size of such systems may require unconventional components and manufacturing processes.

SUMMARY

Circuit boards, LED lighting systems and methods of manufacture are described. A circuit board includes a ceramic carrier and a body on the ceramic carrier. The body includes dielectric layers and vias formed completely through a thickness of the dielectric layers. The vias are filled with a dielectric material. A conductive pad is provided on a surface of each of the slots opposite the ceramic carrier.

BRIEF DESCRIPTION OF THE DRAWINGS

A more detailed understanding can be had from the following description, given by way of example in conjunction with the accompanying drawings wherein.

DETAILED DESCRIPTION

Figure 1:
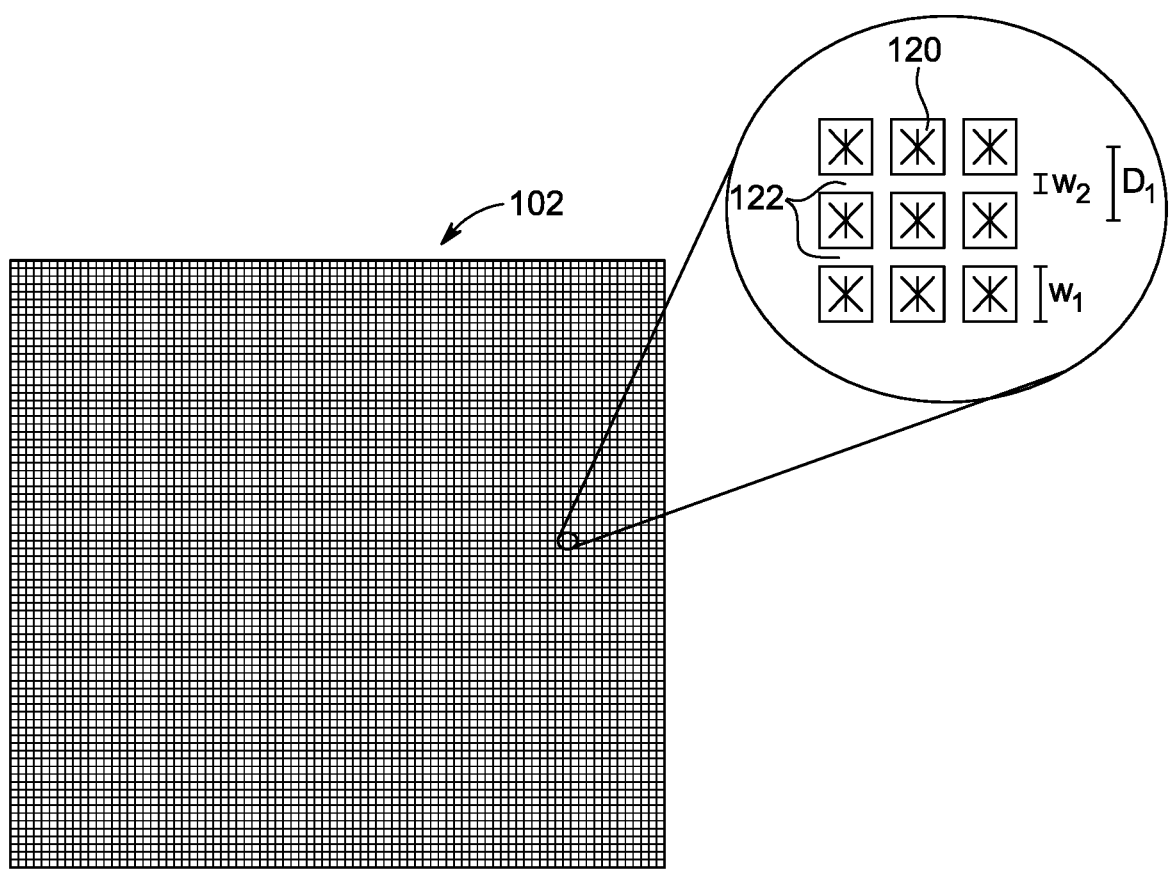
FIG. 1 is a top view of an example LED array.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

FIG. 1 is a top view of an example LED array 102. In the example illustrated in FIG. 1, the LED array 102 is an array of emitters 120. LED arrays may be used for any application, such as those requiring precision control of LED array emitters. Emitters 120 in the LED array 102 may be individually addressable or may be addressable in groups/subsets.

An exploded view of a 3×3 portion of the LED array 102 is also shown in FIG. 1. As shown in the 3×3 portion exploded view, the LED array 102 may include emitters 120 that each have a width $w_1$. In embodiments, the width $w_1$ may be approximately 100 µm or less (e.g., 30 µm). Lanes 122 between the emitters 120 may be a width, $w_2$, wide. In embodiments, the width $w_2$ may be approximately 20 µm or less (e.g., 5 µm). The lanes 122 may provide an air gap between adjacent emitters or may contain other material. A distance di from the center of one emitter 120 to the center of an adjacent emitter 120 may be approximately 120 µm or less (e.g., 30 µm). It will be understood that the widths and distances provided herein are examples only and that actual widths and/or dimensions may vary.

It will be understood that, although rectangular emitters arranged in a symmetric matrix are shown in FIG. 1, emitters of any shape and arrangement may be applied to the embodiments described herein. For example, the LED array 102 of FIG. 1 may include over 20,000 emitters in any applicable arrangement, such as a 200×100 matrix, a symmetric matrix, a non-symmetric matrix, or the like. It will also be understood that multiple sets of emitters, matrixes, and/or boards may be arranged in any applicable format to implement the embodiments described herein.

As mentioned above, LED arrays, such as the LED array 102, may include emitters that have fine pitch and line spacing. An LED array such as this may be referred to as a micro LED array or simply a micro LED. A micro LED may include an array of individual emitters provided on a substrate or may be a single silicon wafer or die divided into segments that form the emitters. The latter type of micro LED may be referred to as a monolithic LED. Additionally, such arrays may require significant power to power them, such as 60 watts or more, and, therefore, may emit significant heat duration operation. Accordingly, for such arrays, a circuit board is needed that can accommodate the fine line space and provide sufficient heat dissipation.

Embodiments described herein may provide for a circuit board, an LED lighting system incorporating the circuit board and methods of manufacture that may support an LED array with a fine line space and may provide sufficient heat dissipation to meet the heat requirements of such an LED array. Such LED arrays and LED lighting systems may be used in various applications, including, for example, camera flash and vehicle lighting system applications.

Figure 2:
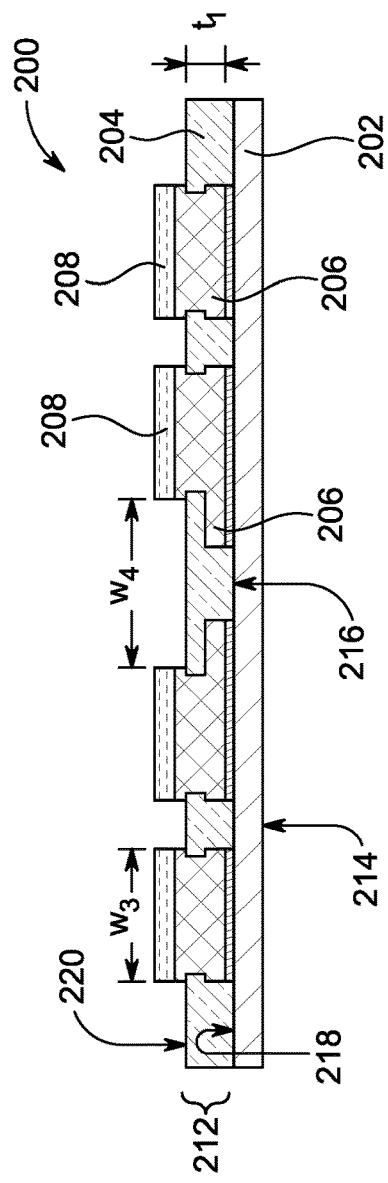
FIG. 2 is a cross-sectional view of an example circuit board.

FIG. 2 is a cross sectional view of a circuit board 200. In the example illustrated in FIG. 2, the circuit board 200 includes a ceramic carrier 202. The ceramic carrier 202 may have a top surface 218 and a bottom surface 214. A body 212 is disposed on the top surface 218 of the ceramic carrier 202. The body 212 has a top surface 220 and a bottom surface 216, and the bottom surface 216 is disposed on the top surface 218 of the ceramic carrier 202. The body 212 may be formed from layers 204 of a dielectric material. A number vias 206 are formed through the layers 204 of the dielectric material. In embodiments, the vias are formed completely through a thickness ($t_1$) of the layers 204 of the dielectric material. The vias 206 may be filled and/or plated with a metal material. Where the vias are formed completely through the entire thickness of the layers 204 of the dielectric material, the metal in the vias 206 contacts the ceramic carrier 202. A metal pad 208 may be disposed on a surface of each of the vias 206 opposite the ceramic carrier 202.

The vias 206 may be arranged in pairs to enable contacting LED devices or emitters that each may include a pair of metal contacts. In embodiments, the vias 206 may be micro-vias or slots and may have a width $w_3$, and a space between adjacent pairs of vias may have a width $w_4$. In embodiments $w_3$ may be in a range of 50 µm to 200 µm, and $w_4$ may be in a range of 20 µm to 200 µm. The small widths of the vias 206 and the small spacing between pairs of the vias 206 may enable use of the circuit board 200 with an LED array, such as the LED array 100 of FIG. 1, with fine line spacing.

The vias 206 may be filled and/or plated with a metal material that has good thermal conductivity. In embodiments, the metal material may be a copper, silver or nickel material. The ceramic carrier 202 may be formed from a material with high thermal conductivity and high electrical resistivity. In embodiments, the ceramic carrier 202 may be formed from Aluminum Nitride (AlN), Zirconia ($ZrO_2$) or Aluminum Oxide ($Al_2O_3$). The use of such a material for the ceramic carrier 202 enables the vias 206 to be used both to make electrical connections to the conductive pads 208 and also to dissipate heat from any LED array or semiconductor device mounted on the conductive pads 208. In other words, when the vias 206 are formed through the entire thickness of the layers 204 of the dielectric material, the vias 206 may dissipate heat from an LED array or other semiconductor device mounted on the metal pads 208 to the ceramic carrier 202, which may quickly dissipate the heat into the environment due to its high thermal conductivity. Further, because the ceramic carrier 202 has good electrical resistivity, it may prevent shorting of the vias 206 to each other.

As mentioned above, the body 212 may have a thickness $t_1$. In embodiments, the thickness $t_1$ may be in a range 20 µm to 50 µm. Thus, the thickness $t_1$ may be kept relatively thin to minimize the insulation contributed by the circuit board.

Figure 3:
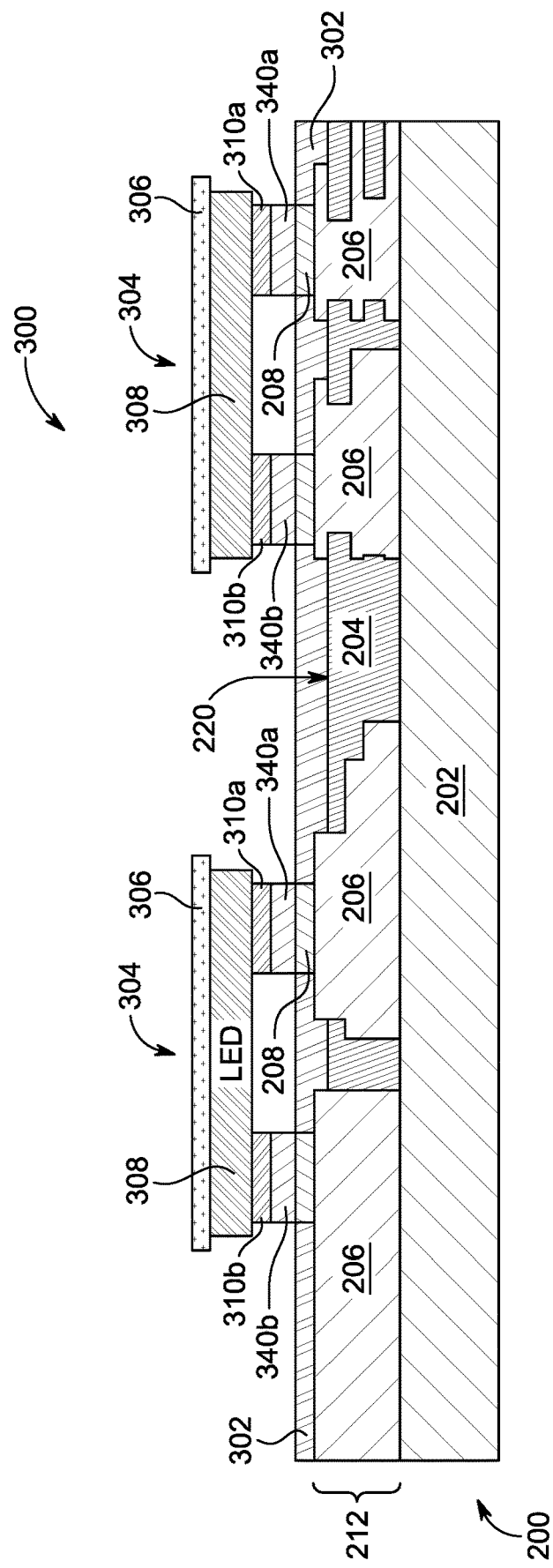
FIG. 3 is a cross-sectional view of an example LED lighting system that incorporates the circuit board of FIG. 2.

FIG. 3 is a cross sectional view of an LED lighting system 300 that includes the circuit board 202 of FIG. 2 with an array of light-emitting diode (LED) devices 304 mounted thereon. While the example illustrated in FIG. 3 includes an array of individual LED devices 304, the embodiments described herein are applicable to any type of LED array, such as the LED array 102 of FIG. 1, which may be an array of individual LED devices or a monolithic LED array that includes a single silicon wafer or die divided into segments that form the emitters. When a monolithic LED array is used, each of the emitters in the array may have a pair of metal contacts that may be electrically coupled to corresponding pairs of metal pads on the circuit board (e.g., via solder).

In the example illustrated in FIG. 3, each of the LED devices 304 includes a semiconductor structure 308, a wavelength converting layer 306 over the semiconductor structure 308 and two metal contacts 310a and 310b. The semiconductor structure may be any type of semiconductor structure that emits light when excited and may include one or more p-type regions, n-type regions and active, light-emitting regions. In embodiments, the two contacts 310a and 310b may be a p-type electrode and an n-type electrode, respectively. The wavelength converting layer 306 may be remote from, proximal to, or directly above the semiconductor structure 308. The active layer in the semiconductor structure 308 emits light into the wavelength converting layer 306 when turned on, and the wavelength converting layer 306 acts to further modify the wavelength of the light emitted by the active layer. The wavelength converting layer 306 may include any luminescent material, such as, for example, phosphor particles in a transparent or translucent binder or matrix, or a ceramic phosphor element, which absorbs light of one wavelength and emits light of a different wavelength.

In the example illustrated in FIG. 3, each of the pairs of contacts 310a and 310b of each of the LED devices 304 is electrically coupled (e.g., via solder) to a corresponding pair of the metal pads 208 on the circuit board 200. A soldermask layer 302 is provided on the top surface 220 of the circuit board 200 in areas that are not occupied by metal pads 208. In embodiments, the soldermask layer 302 may be any layer or type of material that protects the circuit board and/or reflects light.

As mentioned above, an LED lighting system, such as illustrated in FIG. 3, may be used in a number of different applications, and may be particularly useful in vehicle headlamp systems and flash applications where closely packed LED arrays and/or individually addressable LED devices or emitters may be desirable. FIGS. 4, 5, 6 and 7 are diagrams of example application systems that may incorporate LED lighting systems, such as the LED lighting system 300 of FIG. 3.

Figure 4:
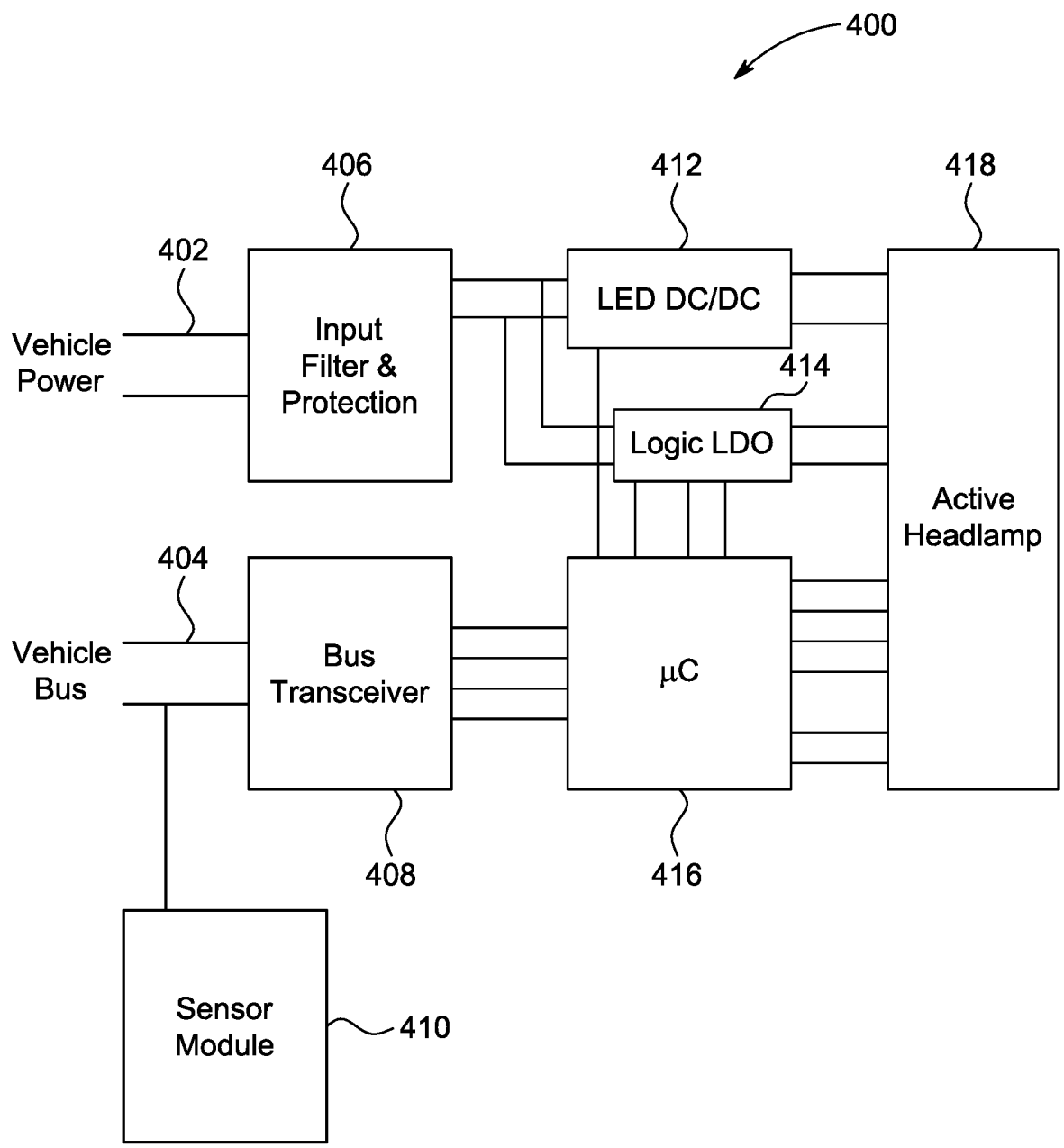
FIG. 4 is a diagram of an example vehicle headlamp system that incorporates the LED lighting system of FIG. 3.

FIG. 4 is a diagram of an example vehicle headlamp system 400 that may incorporate an LED lighting system, such as the LED lighting system 300 of FIG. 3. The example vehicle headlamp system 400 illustrated in FIG. 4 includes power lines 402, a data bus 404, an input filter and protection module 406, a bus transceiver 408, a sensor module 410, an LED direct current to direct current (DC/DC) module 412, a logic low-dropout (LDO) module 414, a micro-controller 416 and an active head lamp 418. In embodiments, the active head lamp 418 may include an LED lighting system, such as the LED lighting system 300 of FIG. 3.

The power lines 402 may have inputs that receive power from a vehicle, and the data bus 404 may have inputs/outputs over which data may be exchanged between the vehicle and the vehicle headlamp system 400. For example, the vehicle headlamp system 400 may receive instructions from other locations in the vehicle, such as instructions to turn on turn signaling or turn on headlamps, and may send feedback to other locations in the vehicle if desired. The sensor module 410 may be communicatively coupled to the data bus 404 and may provide additional data to the vehicle headlamp system 400 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 400. In FIG. 4, the headlamp controller may be a micro-controller, such as micro-controller (pc) 416. The micro-controller 416 may be communicatively coupled to the data bus 404.

The input filter and protection module 406 may be electrically coupled to the power lines 402 and may, for example, support various filters to reduce conducted emissions and provide power immunity. Additionally, the input filter and protection module 406 may provide electrostatic discharge (ESD) protection, load-dump protection, alternator field decay protection, and/or reverse polarity protection.

The LED DC/DC module 412 may be coupled between the filter and protection module 406 and the active headlamp 418 to receive filtered power and provide a drive current to power LEDs in the LED array in the active headlamp 418. The LED DC/DC module 412 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 414 may be coupled to the input filter and protection module 406 to receive the filtered power. The logic LDO module 414 may also be coupled to the micro-controller 414 and the active headlamp 418 to provide power to the micro-controller 464 and/or the silicon backplane (e.g., CMOS logic) in the active headlamp 418.

The bus transceiver 408 may have, for example, a universal asynchronous receiver transmitter (UART) or serial peripheral interface (SPI) interface and may be coupled to the micro-controller 416. The micro-controller 416 may translate vehicle input based on, or including, data from the sensor module 410. The translated vehicle input may include a video signal that is transferrable to an image buffer in the active headlamp module 418. In addition, the micro-controller 416 may load default image frames and test for open/short pixels during startup. In embodiments, an SPI interface may load an image buffer in CMOS. Image frames may be full frame, differential or partial frames. Other features of micro-controller 416 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 5:
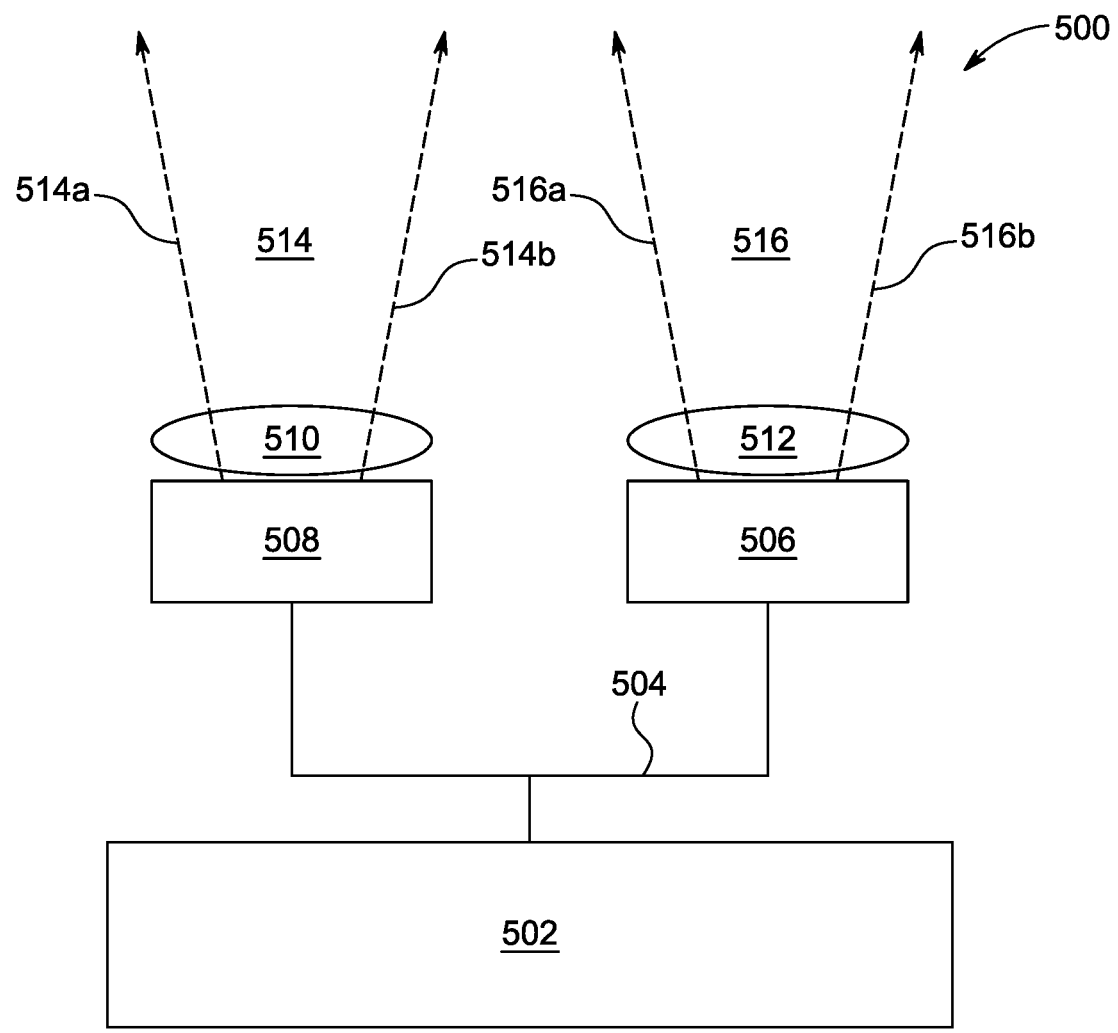
FIG. 5 is a diagram of another example vehicle headlamp system.

FIG. 5 is a diagram of another example vehicle headlamp system 500. The example vehicle headlamp system 500 illustrated in FIG. 5 includes an application platform 502, two LED lighting systems 506 and 508, and optics 510 and 512. The two LED lighting systems 506 and 508 may be LED lighting systems, such as the LED lighting system 300 of FIG. 3, or may include the LED lighting system 300 plus some of all of the other modules in the vehicle headlamp system 400 of FIG. 4. In the latter embodiment, the LED lighting systems 506 and 508 may be vehicle headlamp sub-systems.

The LED lighting system 508 may emit light beams 514 (shown between arrows 514a and 514b in FIG. 5). The LED lighting system 506 may emit light beams 516 (shown between arrows 516a and 516b in FIG. 5). In the embodiment shown in FIG. 5, a secondary optic 510 is adjacent the LED lighting system 508, and the light emitted from the LED lighting system 508 passes through the secondary optic 510. Similarly, a secondary optic 512 is adjacent the LED lighting system 512, and the light emitted from the LED lighting system 512 passes through the secondary optic 512. In alternative embodiments, no secondary optics 510/512 are provided in the vehicle headlamp system.

Where included, the secondary optics 510/512 may be or include one or more light guides. The one or more light guides may be edge lit or may have an interior opening that defines an interior edge of the light guide. LED lighting systems 508 and 506 (or the active headlamp of a vehicle headlamp sub-system) may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 508 and 506 in a desired manner, such as, for example, with a gradient, a chamfered distribution, a narrow distribution, a wide distribution, or an angular distribution.

The application platform 502 may provide power and/or data to the LED lighting systems 506 and/or 508 via lines 504, which may include one or more or a portion of the power lines 402 and the data bus 404 of FIG. 4. One or more sensors (which may be the sensors in the system 400 or other additional sensors) may be internal or external to the housing of the application platform 502. Alternatively or in addition, as shown in the example LED lighting system 400 of FIG. 4, each LED lighting system 508 and 506 may include its own sensor module, connectivity and control module, power module, and/or LED array.

In embodiments, the vehicle headlamp system 500 may represent an automobile with steerable light beams where LEDs may be selectively activated to provide steerable light. For example, an array of LEDs (e.g., the LED array 102) may be used to define or project a shape or pattern or illuminate only selected sections of a roadway. In an example embodiment, infrared cameras or detector pixels within LED systems 506 and 508 may be sensors (e.g., similar to sensors in the sensor module 410 of FIG. 4) that identify portions of a scene (e.g., roadway or pedestrian crossing) that require illumination.

Figure 6:
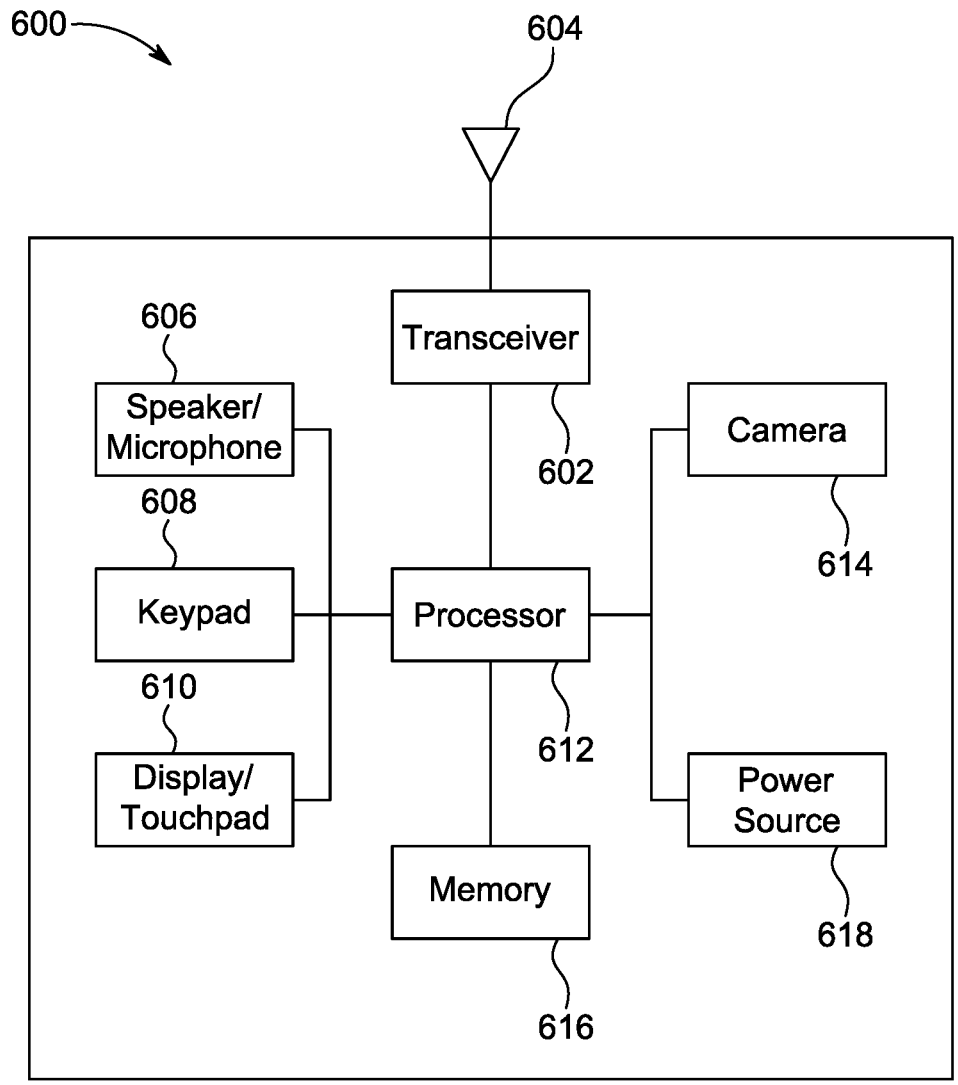
FIG. 6 is a block diagram of an example wireless device.

FIG. 6 is a diagram of an example wireless device 600. In the example illustrated in FIG. 6, the wireless device 600 includes a processor 612, a transceiver 602, an antenna 604, a speaker/microphone 606, a keypad 608, a display/touchpad 610, a memory 616, a power source 618, and a camera 614.

The processor 612 may be a general purpose processor, a special purpose processor, a conventional processor, a digital signal processor (DSP), a microprocessor, one or more microprocessors in association with a DSP core, a controller, a microcontroller, an application specific integrated circuit (ASIC), a field programmable gate array (FPGA) circuit, an integrated circuit (IC), a state machine, and the like. The processor 612 may be coupled to, and may receive user input data from, the speaker/microphone 606, the keypad 608, the display/touchpad 610 and/or the camera 614. The processor 612 may also output user data to the speaker/microphone 606, the keypad 608, the display/touchpad 610 and/or the camera 614. In addition, the processor 612 may access information from, and store data in, any type of suitable memory, such as the memory 616. The processor 612 may receive power from the power source 618 and may be configured to distribute and/or control the power to the other components in the wireless device 600.

The processor 612 may also be coupled to the camera 614. In embodiments, the camera 614 may include, for example, an image sensor, read out circuitry, a flash module and/or any other required circuitry or controls required to operate the camera 614. In embodiments, the flash module may include an LED lighting system, such as the LED lighting system 300 of FIG. 3, and a driver, one or more sensors and/or any other circuitry or controls required to operate the flash.

Figure 7:
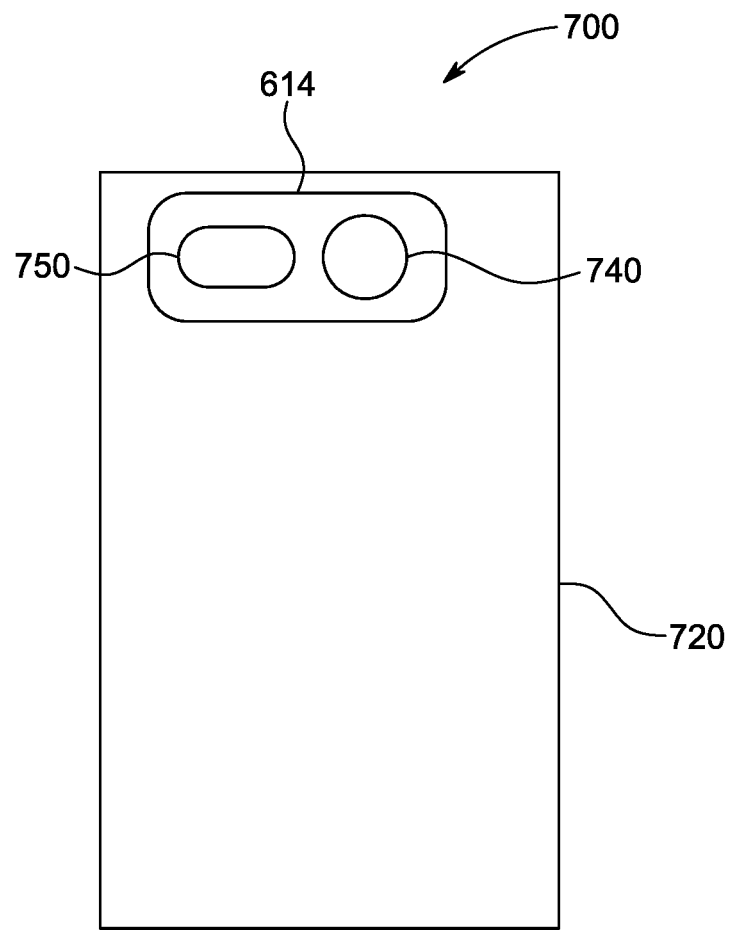
FIG. 7 is a back view of another example wireless device.

FIG. 7 is a back view of a wireless device 700 showing more detail of the camera 614. In the example illustrated in FIG. 7, the wireless device 700 includes a casing 720 and a camera 614. The camera 614 include a lens 740 via which the camera's image sensor (not shown in FIG. 7) may capture an image of a scene. The camera module 614 may also include a flash 750 that may include one or more LED arrays, which may be a part of one or more LED lighting systems, such the LED lighting system 300 of FIG. 3.

Figure 8:
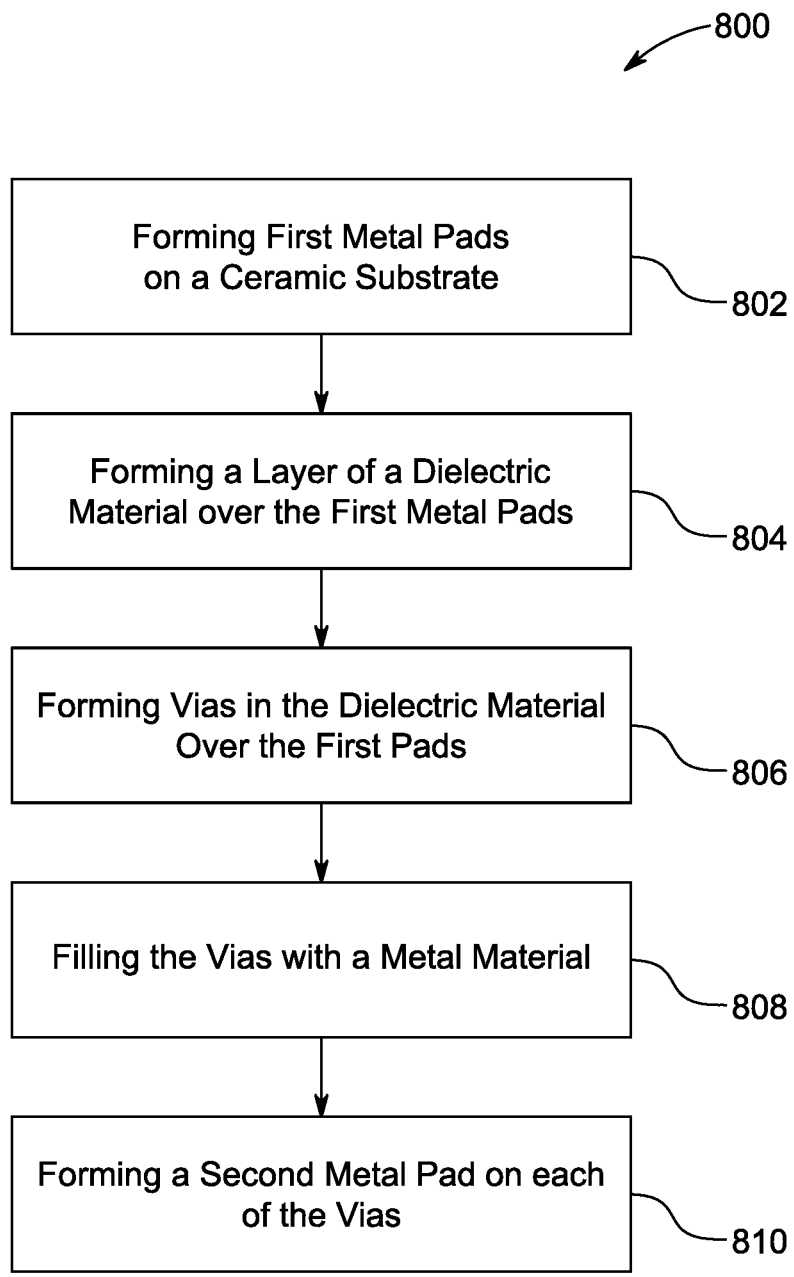
FIG. 8 is a flow diagram of an example method of manufacturing an LED lighting system, such as the LED lighting system of FIG. 3.

FIG. 8 is a flow diagram of an example method 800 of manufacturing an LED lighting system, such as the LED lighting system 300 of FIG. 3. FIGS. 9A, 9B, 9C, 9D, 9E, 9F, 9G, 9H, 9I, 9J, 9K, 9L, 9M, 9N, 9O, 9P and 9Q are cross sectional views of the LED lighting system at various stages in the manufacturing method. In embodiments, a high density interconnect buildup process with finer geometries is used to build up dielectric layers on the ceramic carrier. Various dielectric materials may be used, such as, for example, organic materials, or, more specifically, a Bismaleimide Triazine (BT) resin. The ceramic carrier (e.g., AlN carrier) may be used as the backbone for the buildup process.

In the example method 800 of FIG. 8, first metal pads are formed on a ceramic carrier (802), such as an AlN carrier, as described above. FIGS. 9A, 9B, 9C, 9D, 9E, 9F and 9G provide example structures at various points in the formation of first metal pads.

Figure 9A:
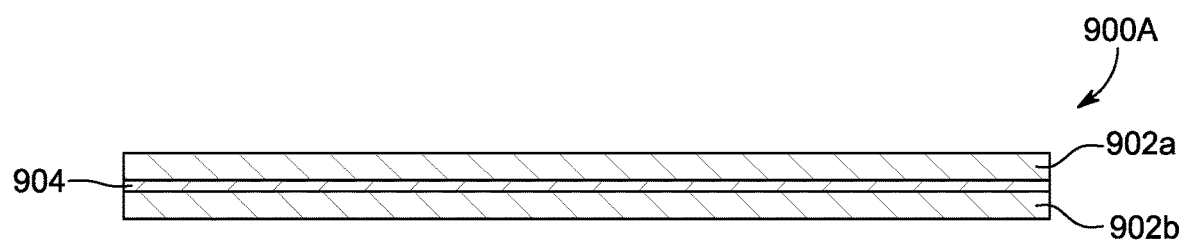
FIGS. 9A, 9B, 9C, 9D, 9E, 9F, 9G, 9H, 9I, 9J, 9K, 9L, 9M, 9N, 9O, 9P and 9Q are cross sectional views of the LED lighting system at various stages in the manufacturing method.

In embodiments, the method may be used to simultaneously manufacture multiple circuit boards. For example, as shown in FIG. 9A, two ceramic carriers 902a and 902b may be attached to one another using, for example, an adhesive 904 to form a structure 900A. In embodiments, the adhesive may be a tape or a temporary glue. In the example illustrated in FIG. 9A, the adhesive 904 is disposed between a first ceramic carrier 902a and a second ceramic carrier 902b. While the examples in FIGS. 9A-9Q illustrate simultaneous manufacture of multiple circuit boards, one of ordinary skill in the art will recognize that a similar method may be used to manufacture a single circuit board (e.g., by not bonding two carriers and not performing processing on both carriers).

Figure 9B:
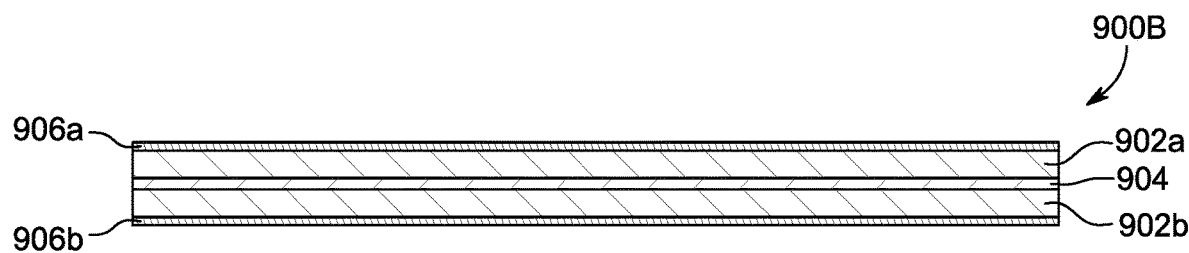

As shown in FIG. 9B, a layer of a metal material 906a and 906b may be formed on outer surfaces (e.g., the surfaces that are not bonded together) of the first and second carriers 902a and 902b. In embodiments, the metal layer may be formed by sputtering. For example, copper sputtering may be performed on the structure 900A to form a thin film of copper on the outer surfaces of the carriers 902a and 902b. One of ordinary skill in the art will understand, however, that other methods and materials may be used to form the metal layer on the surfaces of the first and second carriers 902a and 902b.

Figure 9C:
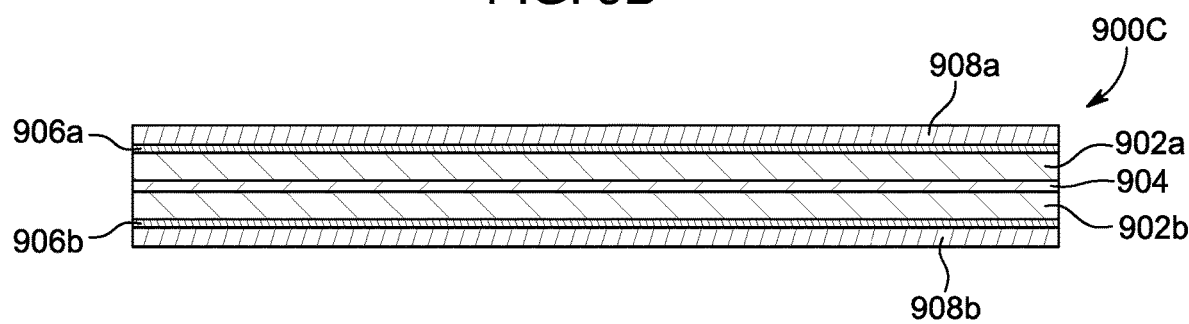

As shown in FIG. 9C, a film 908a and 908b may be formed on each of the metal layers 906a and 906b to form a structure 900C. In embodiments, the film may be a dry film, such as a photoresist, formed using dry film lamination. One of ordinary skill in the art will understand, however, that other methods, such as spin coating, may be used to form the film 908a and 908b on the surfaces of the metal layers 906a and 906b.

Figure 9D:
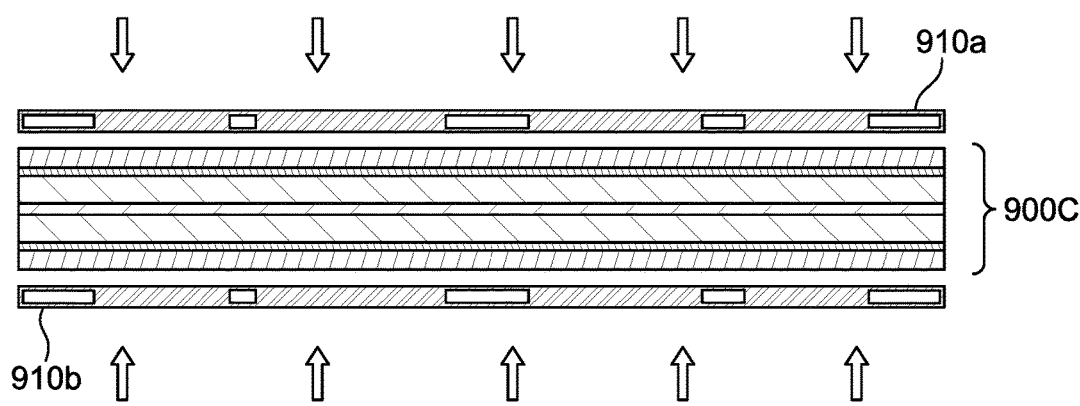
Figure 9E:
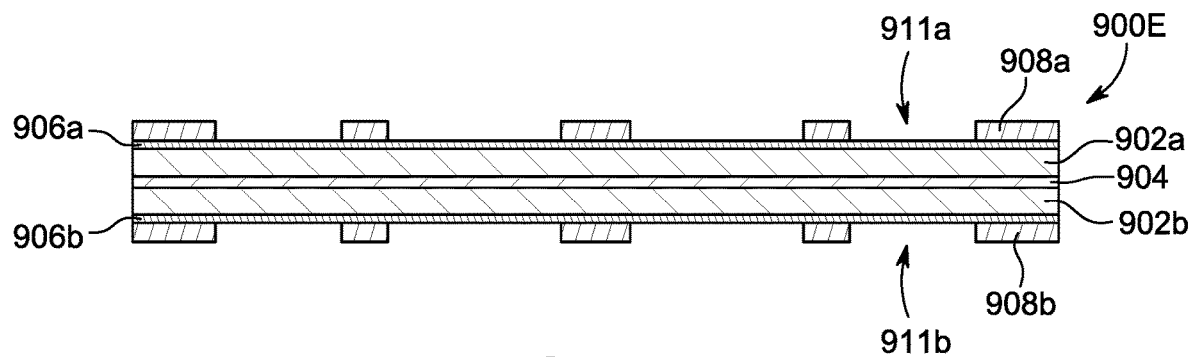

As shown in FIG. 9D, the structure 900C may undergo an imaging or photolithography process to remove portions of the film 908a and 908b to form openings in the film and form a structure 900D. In embodiments, this may be performed by placing a pattern 910a and 910b, such as a glass pattern, over the structure 900C and exposing the structure 900C to light (e.g., ultraviolet (UV) light) emitted through the pattern. This may result in the UV light impinging on portions of the film 908a and 908b that are desired to be removed or, alternatively, on portions of the film 908a and 908b that are not to be removed.

As shown in 9E, desired portions of the film 908a and 908b may be removed, for example, by applying a developer to the structure 900D. Different types of developers may be used. In embodiments, the portions of the film 908a an 908b that were exposed to the light in FIG. 9D may become soluble to the developer or the portions of the film 908a and 908b that were not exposed to the light in FIG. 9D may become soluble to the developer. Exposure of the structure 900D to the developer may result in the structure 900E with openings 911a and 911b formed in the film 908a and 908b. The openings 911a and 911b may form a portion of the vias 206 in the circuit board 200 of FIG. 2.

Figure 9F:
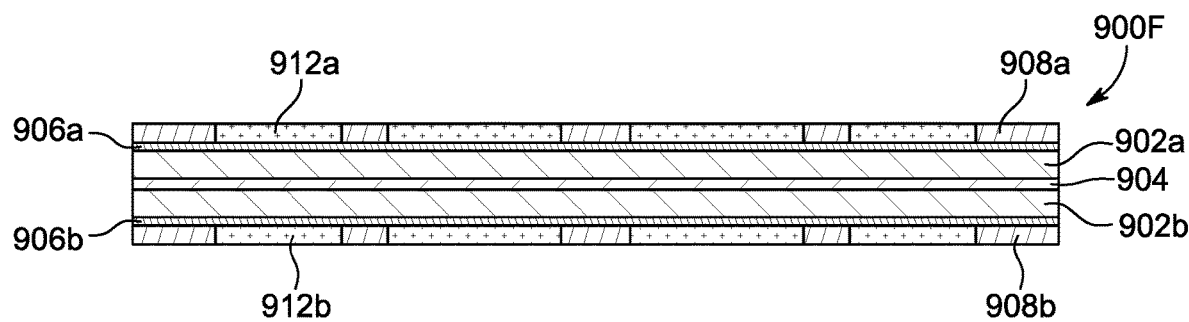

As shown in FIG. 9F, the openings 911a and 911b in the film 908a and 908b may be filled and/or plated with a metal material to form the structure 900F. In embodiments, the openings extend through the entirety of the film 908a and 908b and leave corresponding regions of the ceramic carriers 902a and 902b exposed. The openings 911a and 911b may be plated and/or otherwise filled with a metal material (e.g., copper) to form metal-plated and/or filled openings 912a and 912b.

Figure 9G:
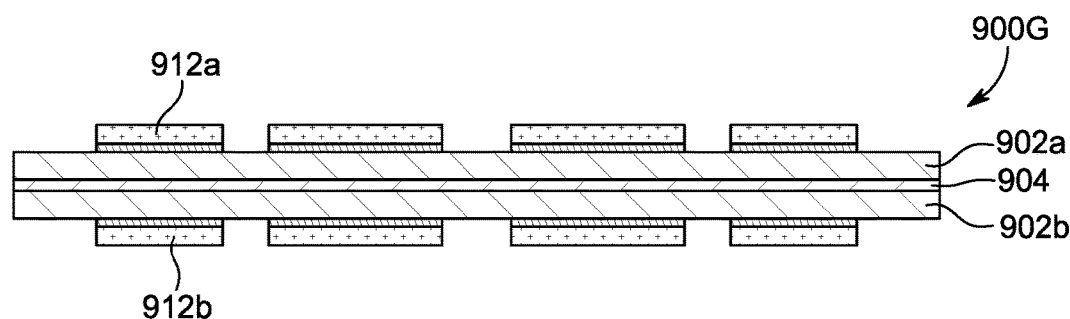

As shown in FIG. 9G, the remaining portions of the film 908a and 908b and the portions of the metal layer 906a and 906b under them may be removed, and first metal pads 912a and 912b remain on the carriers 902a and 902b to form a structure 900G. This may be performed, for example, by stripping away the remaining portions of the film 908a and 908b and then performing copper or other metal etching on the portions of the metal layer 906a and 906b underneath. The resulting panel may then be ready for further build up processes.

Figure 9H:
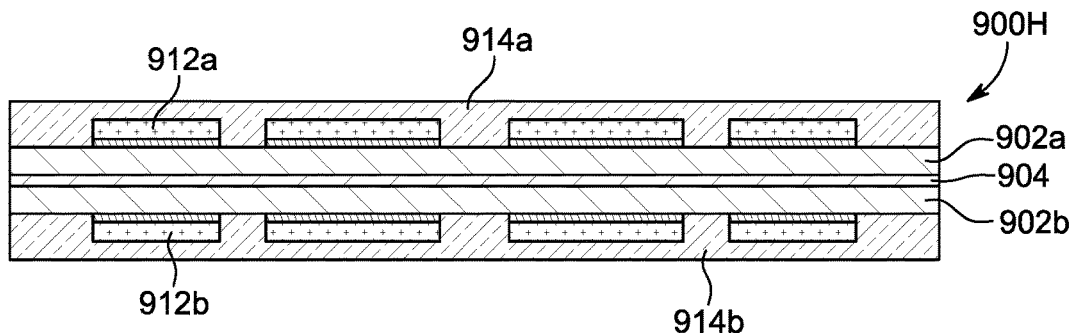

Referring back to FIG. 8, a layer of a dielectric material may be formed over the first metal pads (804). FIG. 9H provides an example structure 900H showing the layers of the dielectric material 914a and 914b formed over the first metal pads 912a and 912b. In embodiments, the dielectric material may be laminated over the first metal pads 912a and 912b, although one of ordinary skill in the art will understand that other methods may be used, such as molding.

Figure 9I:
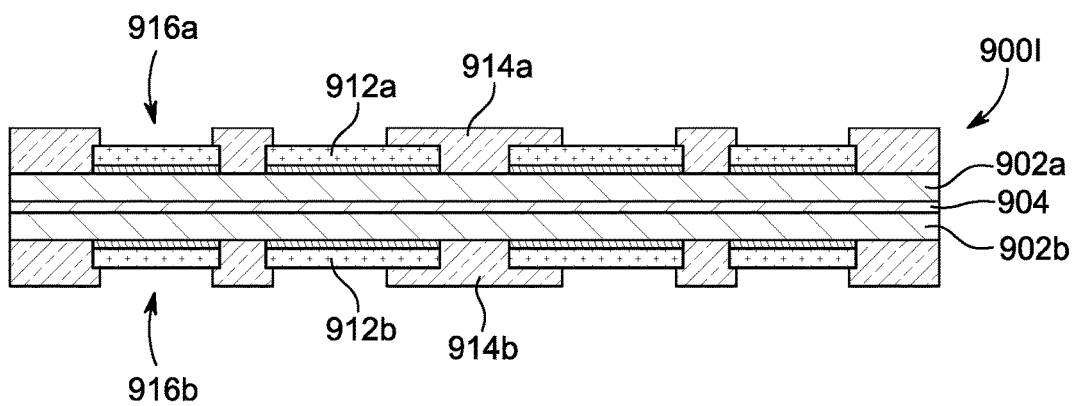

Vias may be formed in the dielectric material over the first metal pads (806). FIG. 9I provides an example structure 900I showing the vias 916a and 916b formed in the layers of the dielectric material 914a and 914b. In embodiments, the vias 916a and 916b may be micro-vias or slots and may be formed, for example, using laser ablation or drilling, although one of ordinary skill in the art will understand that other methods may be used. The vias 916a and 916b may form another part of the vias 206 in the circuit board 200 of FIG. 2. Combined, the openings 911a and 911b and the vias 916a and 916b may form the vias 206 formed through the entire thickness $t_1$ of the dielectric layers 204 in FIG. 2.

Figure 9J:
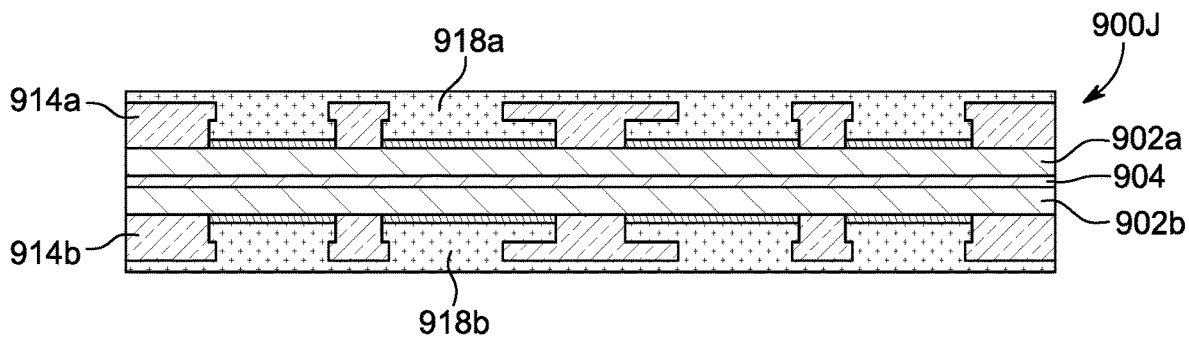

The vias may be filled with a metal material (808). FIG. 9J illustrates an example structure 900J showing the vias 916a and 916b filled with a metal material 918a and 918b. In embodiments, the vias may be filled using copper plating, which may leave a layer of the metal material 918a and 918b on the outer-most surfaces of the dielectric material 914a and 914b and the vias 916a and 916b, as shown. One of ordinary skill in the art will understand, however, that other techniques may be used to fill the vias 916a and 916b.

A second metal pad may be formed on each of the vias (810) to form, for example, metal pads on the outer-most surface of the circuit board. FIGS. 9K, 9L, 9M, 9N, 9O, 9P and 9Q provide example structures at various points in the formation of the second metal pads.

Figure 9K:
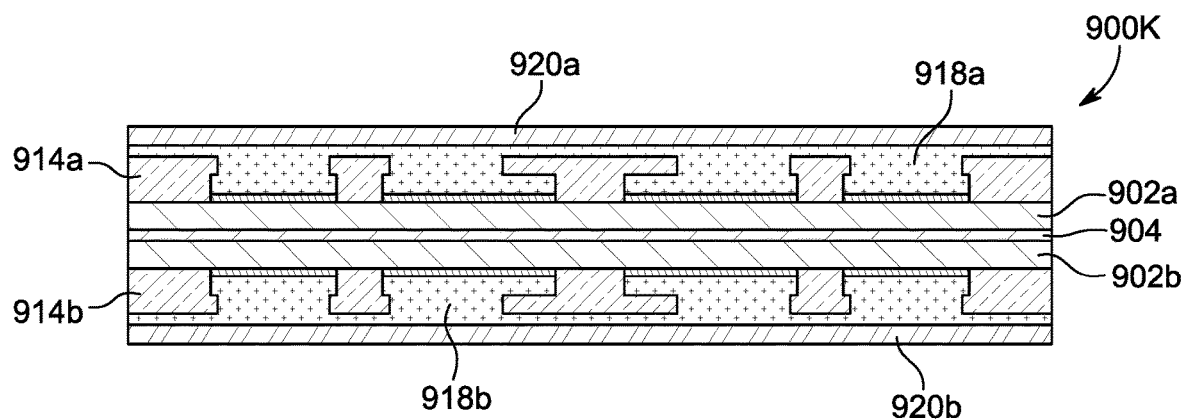

As shown in FIG. 9K, similar to the process described above with respect to FIG. 9C, a film 920a and 920b may be formed on outer-most surfaces of the structure 900J (e.g., over the metal 918a and 918b to form a structure 900K. In embodiments, the film may be a dry film, such as a photoresist, formed using dry film lamination. One of ordinary skill in the art will understand, however, that other methods, such as spin coating, may be used to form the film 920a and 920b.

Figure 9L:
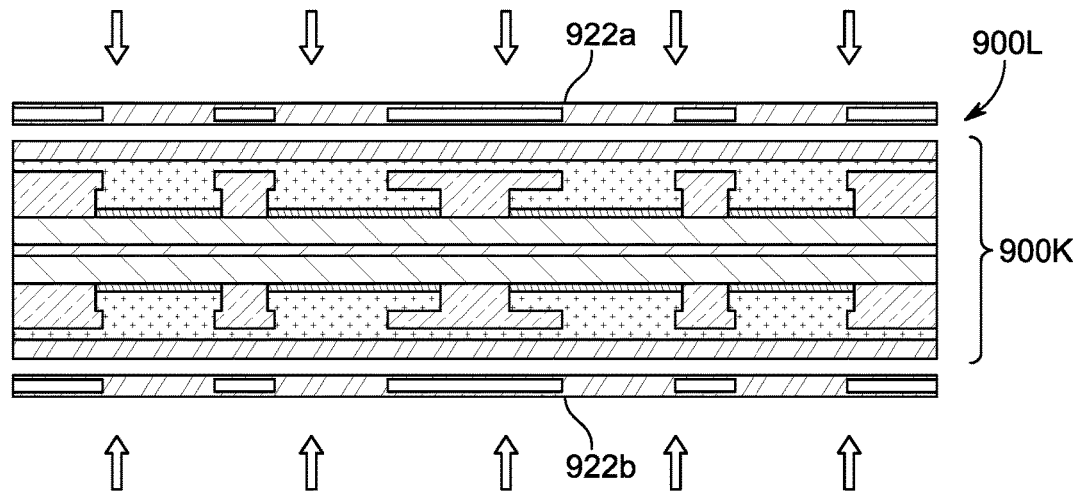

As shown in FIG. 9L, the structure 900K may undergo an imaging or photolithography process to remove portions of the film 920a and 920b in regions between the vias 916a and 916b to form a structure 900L. In embodiments, this may be performed by placing a pattern 922a and 922b, such as a glass pattern, over the structure 900K and exposing the structure 900K to light (e.g., ultraviolet (UV) light) emitted through the pattern. This may result in the UV light impinging on portions of the film 920a and 920b that are desired to be removed or, alternatively, on portions of the film 920a and 920b that are not to be removed.

Figure 9M:
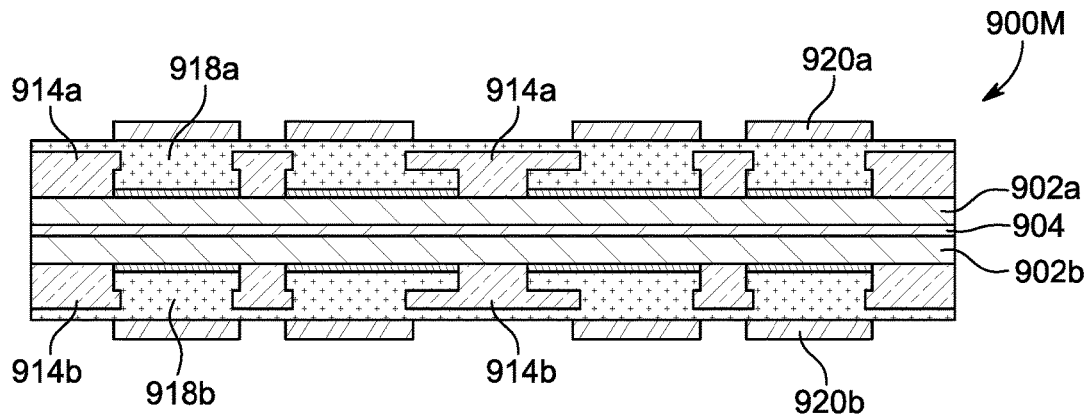

As shown in FIG. 9M, desired portions of the film 920a and 920b may be removed, for example, by applying a developer to the structure 900L. Different types of developers may be used. In embodiments, the portions of the film 920a and 920b that were exposed to the light in FIG. 9L may become soluble to the developer or the portions of the film 920a and 920b that were not exposed to the light in FIG. 9L may become soluble to the developer. Exposure of the structure 900L to the developer may result in the structure 900M with portions of the film 920a and 920b remaining over the vias 916a and 916b.

Figure 9N:
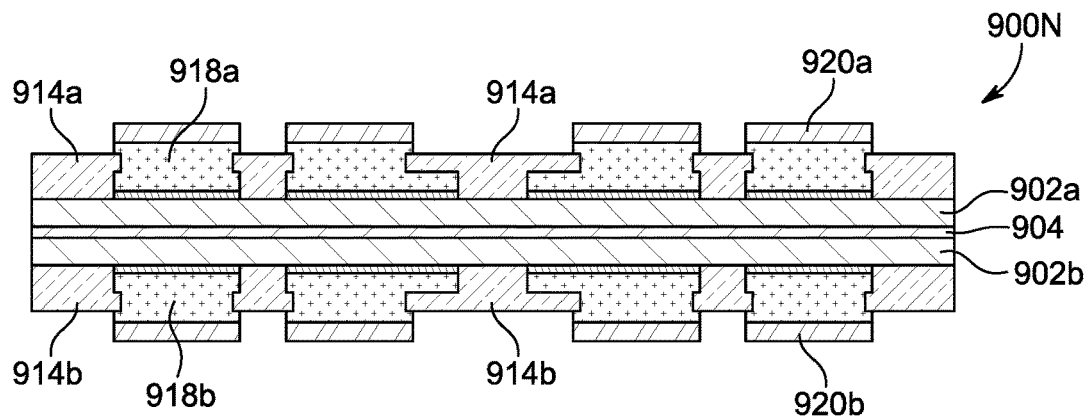

As shown in FIG. 9N, the portions of the metal layer 918a and 918b between the remaining portions of the film 920a and 920b may be removed to form a structure 900N. This may be performed, for example, by copper or other metal etching.

Figure 9O:
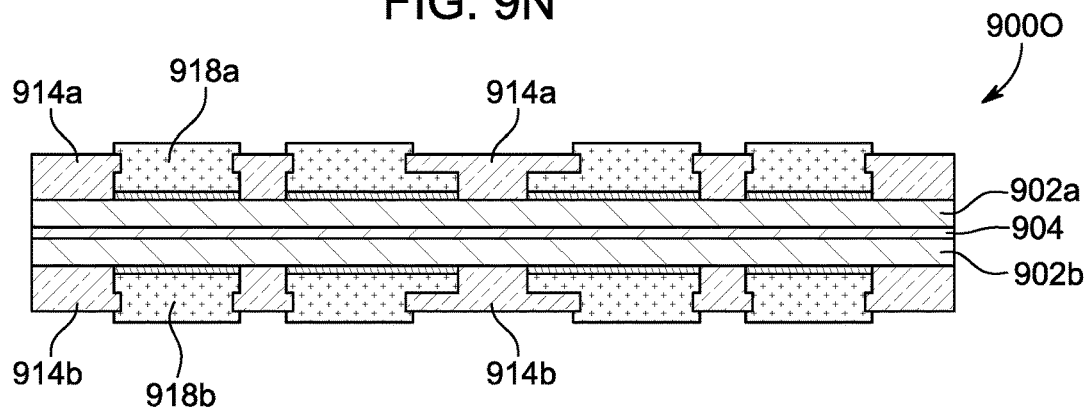

As shown in FIG. 9O, the remaining portions of the film 920a and 920b may be removed to form a structure 900O. This may be performed, for example, by stripping away the remaining portions of the film 920a and 920b.

Figure 9P:
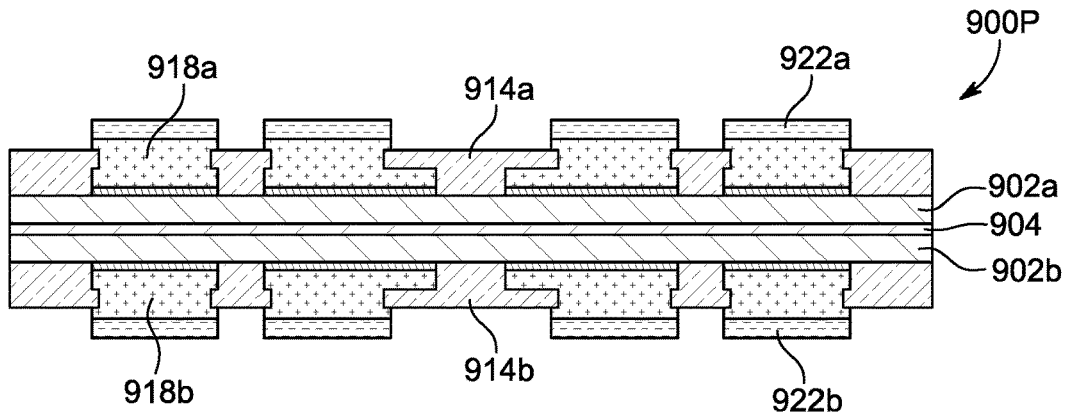
Figure 9Q:
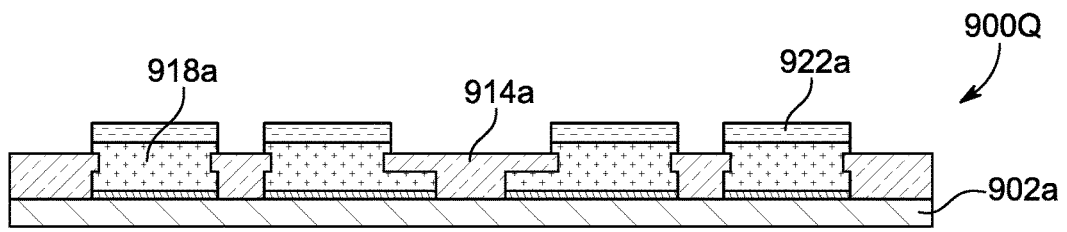

As shown in FIG. 9P, the second metal pads 922a and 922b may be provided on each of the metal-filled vias 918a and 918b. In embodiments, this may be performed using NiAu plating, although one of ordinary skill in the art will recognize that other methods and/or metal materials may be used.

As shown in FIG. 9Q, in embodiments where two circuit boards are manufactured simultaneously, the two circuit boards may be separated. Only one of the separated circuit boards 900Q is shown in FIG. 9Q. The circuit board may then be ready for individual LED device or monolithic LED array attach by, for example, soldering metal pads of the individual LED devices or the monolithic array to the metal pads 922a and/or 922b of the circuit board.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A method of manufacturing a light-emitting diode (LED) lighting system, the method comprising:
   adhering a first ceramic carrier to a second ceramic carrier;
   forming a plurality of first metal pads on each of the first and second ceramic carriers with spaces between each of the plurality of first metal pads on each of the first and second ceramic carriers;
   forming a layer of a dielectric material over the plurality of first metal pads and filling the spaces between each of the plurality of first metal pads;

forming a plurality of vias in the layer of the dielectric material with a respective one of the plurality of vias formed over each of the plurality of first metal pads;

filling the plurality of vias with a metal material; and forming a second metal pad over each of the plurality of vias; and separating the first ceramic carrier from the second ceramic carrier after the forming the plurality of first metal pads, the forming the layer of the dielectric material, the forming the plurality of vias, the filling the plurality of vias and the forming the second metal pad.

2. The method of claim 1, wherein the forming the plurality of first metal pads comprises:

forming a metal layer over the first ceramic carrier and the second ceramic carrier;

forming a photoresist layer over the metal layer;

removing portions of the photoresist layer in regions corresponding to the first metal pads to form a plurality of cavities;

filling the plurality of cavities with the metal material; and removing all remaining portions of the photoresist layer.

3. The method of claim 1, wherein the forming the plurality of vias in the layer of the dielectric material comprises one of drilling and laser direct imaging to form a plurality of micro-vias or slots.

4. The method of claim 1, further comprising soldering individual LED devices onto the second metals pads.

5. The method of claim 1, further comprising soldering a monolithic LED array onto the second metal pads.

6. The method of claim 1, wherein the first and second ceramic carriers are formed from Aluminum Nitride (AlN).

7. The method of claim 1, wherein the forming the plurality of vias further comprises forming the plurality of vias in pairs such that adjacent pairs of the plurality of vias are spaced apart by spaces each having a width in a range of 20 µm to 200 µm.

8. The method of claim 7, wherein a spacing between each of the vias in each pair is smaller than the spacing between the adjacent pairs.

9. The method of claim 1, wherein each of the plurality of vias has a width in a range of 50 µm to 200 µm.

10. The method of claim 1, wherein the metal material comprises one of copper, silver and nickel.

11. The method of claim 1, wherein the forming the layer of the dielectric material further comprises forming a stack of dielectric layers.

12. The method of claim 1, wherein the stack of dielectric layers comprises an organic dielectric material.

13. The method of claim 12, wherein the stack of dielectric layers has a total thickness in a range of 20 µm to 50 µm.

14. The method of claim 12, wherein the stack of dielectric layers comprises a plurality of dielectric layers stacked one on top of the other with no intervening metal between adjacent layers.

15. The method of claim 1, wherein the forming the plurality of vias in the layer of the dielectric material comprises one of drilling and laser direct imaging to form a plurality of micro-vias or slots.

16. The method of claim 1, further comprising soldering individual LED devices onto the second metals pads.

* * * * *